(12) United States Patent
Miao et al.

(10) Patent No.: US 12,015,390 B2
(45) Date of Patent: Jun. 18, 2024

(54) BULK ACOUSTIC WAVE RESONATOR

(71) Applicant: MG MICROELECTRONICS CO., LTD, Shanghai (CN)

(72) Inventors: Jianmin Miao, Shanghai (CN); Ruizhen Zhang, Shanghai (CN)

(73) Assignee: MG MICROELECTRONICS CO., LTD., Shanghai (CN)

( * ) Notice: Subject to any disclaimer, the term of this patent is extended or adjusted under 35 U.S.C. 154(b) by 372 days.

(21) Appl. No.: 17/438,878

(22) PCT Filed: Nov. 3, 2020

(86) PCT No.: PCT/CN2020/126026
§ 371 (c)(1),
(2) Date: Sep. 13, 2021

(87) PCT Pub. No.: WO2021/093630
PCT Pub. Date: May 20, 2021

(65) Prior Publication Data
US 2022/0158607 A1  May 19, 2022

(30) Foreign Application Priority Data
Nov. 12, 2019  (CN) .......................... 201921973912.1

(51) Int. Cl.
*H03H 9/02* (2006.01)
*H03H 9/00* (2006.01)
(Continued)

(52) U.S. Cl.
CPC .......... *H03H 9/02015* (2013.01); *H03H 9/00* (2013.01); *H03H 9/02007* (2013.01); *H03H 9/13* (2013.01); *H03H 9/171* (2013.01)

(58) Field of Classification Search
CPC ... H03H 9/02015; H03H 9/00; H03H 9/02007
(Continued)

(56) References Cited

U.S. PATENT DOCUMENTS

2002/0149300 A1* 10/2002 Kaitila ..................... H03H 3/02
310/365
2008/0174389 A1 7/2008 Mori et al.
(Continued)

FOREIGN PATENT DOCUMENTS

| CN | 1269057 A | 10/2000 |
| CN | 210405247 U | 4/2020 |

(Continued)

OTHER PUBLICATIONS

International Search Report for Application No. PCT/CN2020/126026, dated Jan. 27, 2021, 4 pages including English translation.

*Primary Examiner* — Rakesh B Patel
(74) *Attorney, Agent, or Firm* — Morgan, Lewis & Bockius LLP (57) ABSTRACT

Provided is a bulk acoustic wave resonator. The bulk acoustic wave resonator includes an upper electrode, a piezoelectric layer and a lower electrode. The piezoelectric layer is disposed between the upper electrode and the lower electrode. At least one boundary of an orthogonal projection of the piezoelectric layer on the lower electrode includes a plurality of sawtooth structures.

8 Claims, 11 Drawing Sheets

(51) Int. Cl.
*H03H 9/13* (2006.01)
*H03H 9/17* (2006.01)

(58) Field of Classification Search
USPC .................................................. 333/186–192
See application file for complete search history.

(56) References Cited

U.S. PATENT DOCUMENTS

2019/0007023 A1\* 1/2019 Yen .................... H03H 9/02047
2019/0260346 A1 8/2019 Qian et al.

FOREIGN PATENT DOCUMENTS

| JP | H0878986 A | 3/1996 |
| JP | 2002374144 A | 12/2002 |

\* cited by examiner

BULK ACOUSTIC WAVE RESONATOR

CROSS-REFERENCES TO RELATED APPLICATIONS

This application is a national stage application filed under 35 U.S.C. 371 based on International Patent Application No. PCT/CN2020/126026, filed on Nov. 3, 2020, which claims priority to Chinese Patent Application No. 201921973912.1 filed with the CNIPA on Nov. 12, 2019, the disclosures of which are incorporated herein by reference in their entireties.

TECHNICAL FIELD

The present disclosure relates to the technical field of resonators, for example, to a bulk acoustic wave resonator.

BACKGROUND

An ideal bulk acoustic wave resonator is an acoustic stack composed of an upper electrode, a piezoelectric layer and a lower electrode. The resonator has the advantages of small size and good performance, and is applicable to integrated circuits.

The bulk acoustic wave resonator usually excites a longitudinal bulk acoustic wave propagating in the thickness direction of the piezoelectric layer, and the longitudinal bulk acoustic wave is the main factor affecting the quality of the bulk acoustic wave resonator. However, in addition to generating the desired longitudinal bulk acoustic wave, the bulk acoustic wave resonator generally generates other forms of standing waves in the device, which increases the noise of the bulk acoustic wave resonator and adversely affects the performance of the bulk acoustic wave resonator.

SUMMARY

The present disclosure provides a bulk acoustic wave resonator, in which the generation of other forms of standing waves is prevented. Therefore, the noise of the bulk acoustic wave resonator is reduced, and the performance of the bulk acoustic wave resonator is improved.

A bulk acoustic wave resonator is provided. The bulk acoustic wave resonator includes an upper electrode, a piezoelectric layer and a lower electrode.

The piezoelectric layer is disposed between the upper electrode and the lower electrode.

At least one boundary of an orthogonal projection of the piezoelectric layer on the lower electrode includes a plurality of sawtooth structures.

DETAILED DESCRIPTION

The present disclosure is described below in conjunction with the drawings and embodiments.

Figure 1:
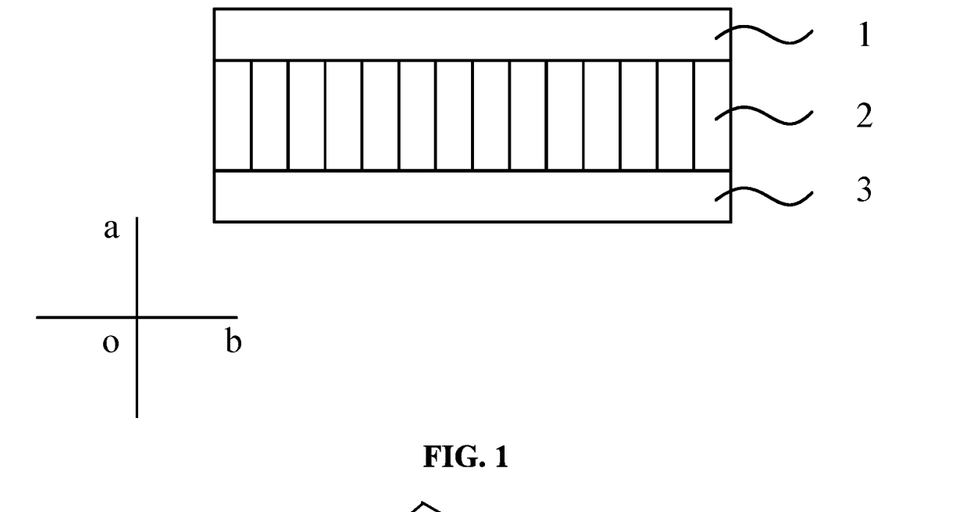
FIG. 1 is a plane structural view of a bulk acoustic wave resonator according to an embodiment.
Figure 2:
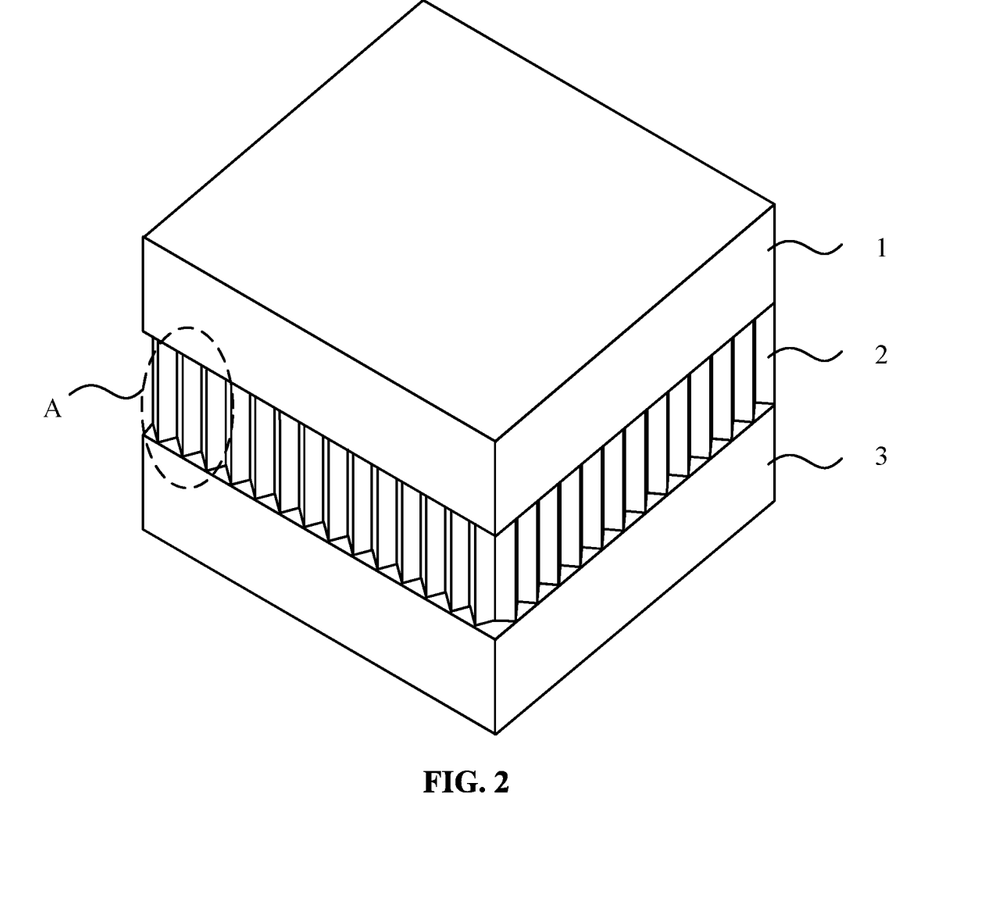
FIG. 2 is a perspective structural view of a bulk acoustic wave resonator according to an embodiment.
Figure 3:
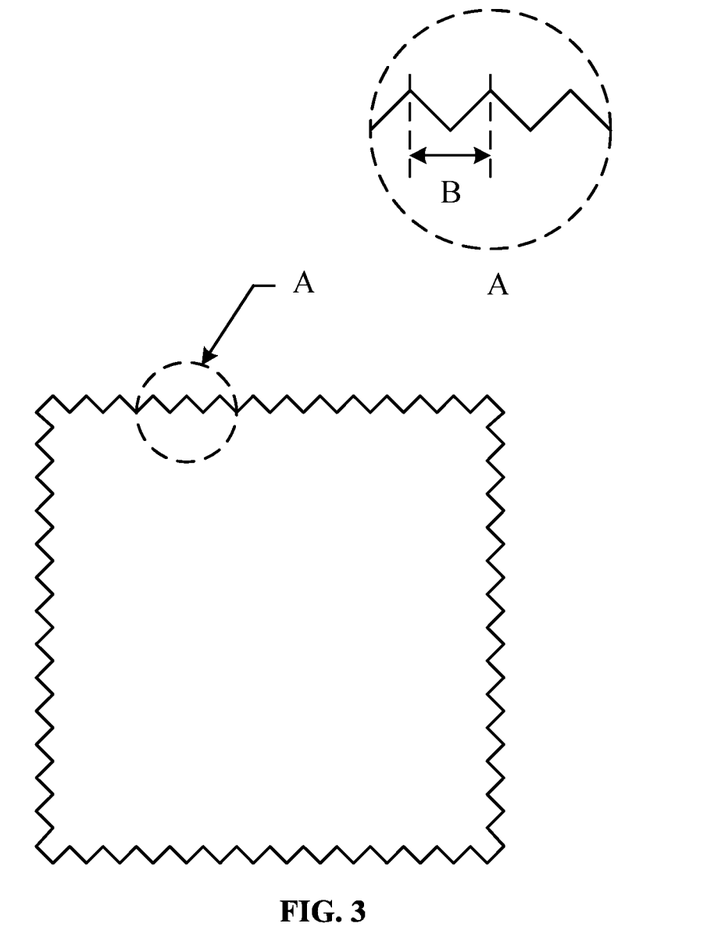
FIG. 3 is a schematic view of an orthogonal projection of a bulk acoustic wave resonator according to an embodiment.

FIG. 1 is a plane structural view of a bulk acoustic wave resonator according to an embodiment, showing a plane side structure of the bulk acoustic wave resonator. FIG. 2 is a perspective structural view of a bulk acoustic wave resonator according to an embodiment, showing a perspective side structure of the bulk acoustic wave resonator. FIG. 3 is a schematic view of an orthogonal projection of a bulk acoustic wave resonator according to an embodiment, illustratively showing the shape of an orthogonal projection of a piezoelectric layer 2 on a lower electrode 3 in the bulk acoustic wave resonator as shown in FIGS. 1 and 2. As shown in FIGS. 1 to 3, the bulk acoustic wave resonator includes an upper electrode 1, a piezoelectric layer 2 and a lower electrode 3. The piezoelectric layer 2 is disposed between the upper electrode 1 and the lower electrode 3. At least one boundary of the orthogonal projection of the piezoelectric layer 2 on the lower electrode includes multiple sawtooth structures.

As shown in FIGS. 1 and 2, the bulk acoustic wave resonator provided by the embodiment may be used for converting electric energy signals into corresponding acoustic wave signals by applying a piezoelectric effect after being connected to an external power supply so as to form resonance based on the resonance technology of bulk acoustic waves. The upper electrode 1 may be connected to one terminal of the external power supply, the lower electrode 3 may be connected to the other terminal of the external power supply, and the piezoelectric layer 2 will correspondingly deform, such as expanding or contracting, along with the change of an electric field generated by the external power supply after being energized, so that a longitudinal bulk acoustic waves is generated in a thickness direction a-o of the piezoelectric layer 2. The longitudinal bulk acoustic wave can be reflected when propagating to the interface between the upper electrode 1 and the air and to the interface between the lower electrode 3 and the air, thereby creating oscillation in the piezoelectric layer 2.

As shown in FIGS. 1 to 3, the side surface of the piezoelectric layer 2 in the thickness direction a-o may be provided with multiple sawtooth structures, so that the side surface of the piezoelectric layer 2 forms an irregular edge. If the piezoelectric layer 2 is orthogonally projected to the lower electrode 3 in the thickness direction a-o, at least one boundary of the orthogonal projection which is projected on a surface of the lower electrode 3 adjacent to the piezoelectric layer 2 and has the same shape as the side surface edge of the piezoelectric layer 2 includes the shape of multiple sawtooth structures A.

Figure 4:
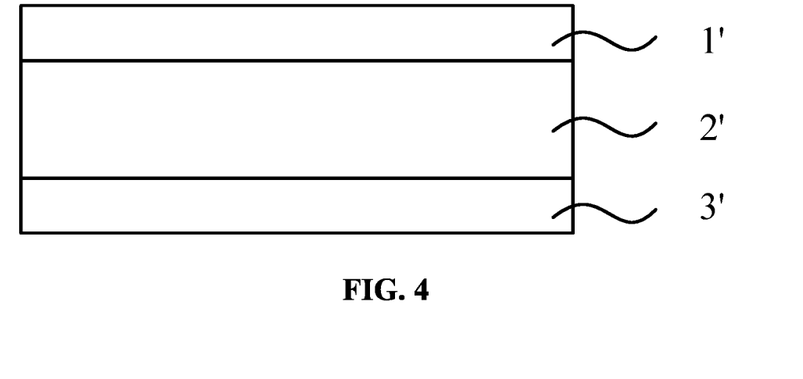
FIG. 4 is a plane structural view of a bulk acoustic wave resonator.

FIG. 4 is a plane structural view of a bulk acoustic wave resonator, showing a plane structure of the bulk acoustic wave resonator in a side view. As shown in FIG. 4, a piezoelectric layer 2' of the bulk acoustic wave resonator has the same size and shape as an upper electrode 1' and a lower electrode 3'. The side surface of the piezoelectric layer 2' is a regular plane structure, and all edges are straight lines. After the bulk acoustic wave resonator is connected to an external power supply, in addition to desired longitudinal bulk acoustic wave, transverse bulk acoustic waves are generated in the piezoelectric layer 2' and form standing waves, thus the noise of the bulk acoustic wave resonator is increased and the performance of the bulk acoustic wave is reduced.

The bulk acoustic wave resonator provided by the embodiment includes an upper electrode, a piezoelectric layer and a lower electrode. The piezoelectric layer is disposed between the upper electrode and the lower electrode. At least one boundary of an orthogonal projection of the piezoelectric layer on the lower electrode includes multiple sawtooth structures. Due to multiple sawtooth structures provided on the side surface of the piezoelectric layer, the side surface of the piezoelectric layer is formed with irregular edges, so that when transverse bulk acoustic waves generated after the piezoelectric layer is energized propagates to the surface of the piezoelectric layer in contact with the air, chaotic reflections or diffuse reflections occur, and thus the formation of transverse standing waves is prevented. Therefore, the problem is solved of the increase of the noise of the bulk acoustic wave resonator and the adverse impact on the performance of the bulk acoustic wave resonator due to the generation of other forms of standing waves in addition to the longitudinal bulk acoustic wave generated by the bulk acoustic wave resonator. Moreover, the generation of other forms of standing waves is prevented, the noise of the bulk acoustic wave resonator is reduced, and the performance of the bulk acoustic wave resonator is improved.

Figure 5:
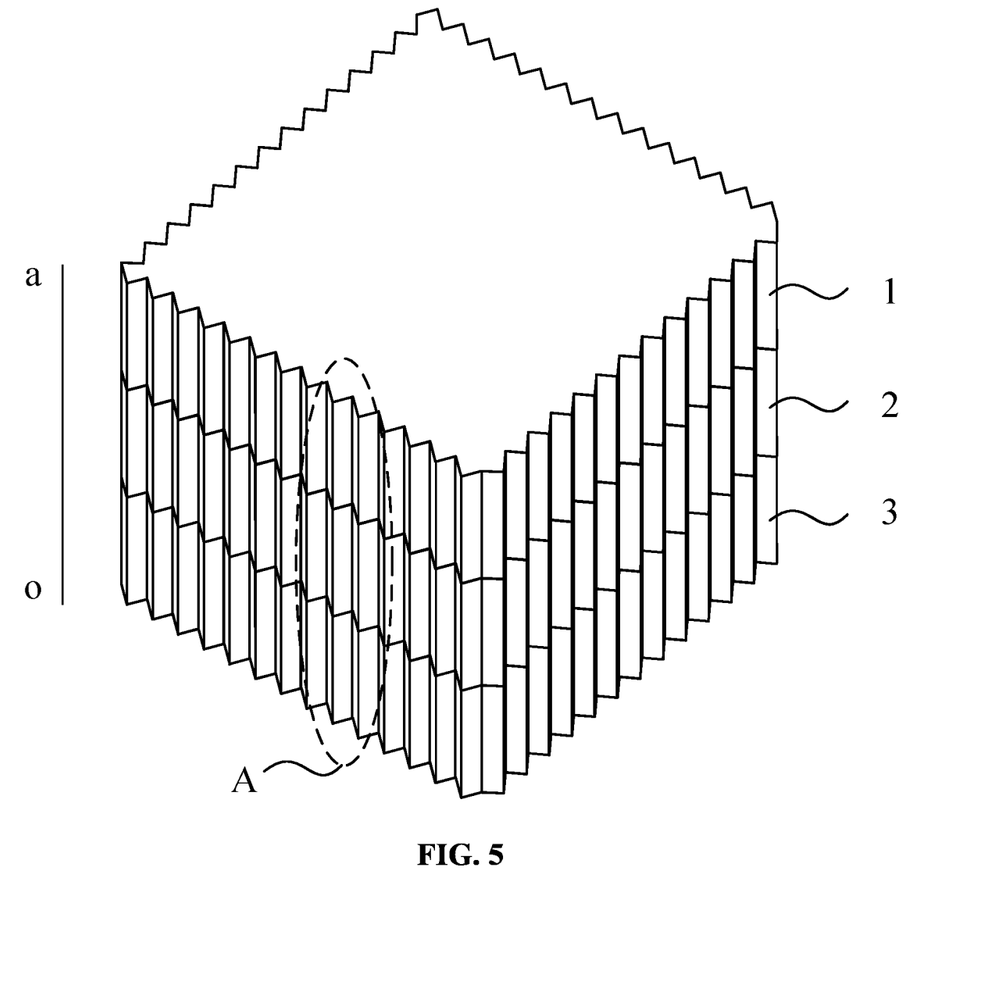
FIG. 5 is a perspective structural view of another bulk acoustic wave resonator according to an embodiment.

FIG. 5 is a perspective structural view of another bulk acoustic wave resonator according to an embodiment. As shown in FIG. 5, optionally, on the basis of the above technical solution, at least one boundary of orthogonal projections of the upper electrode 1 and the lower electrode 3 on a plane perpendicular to the thickness direction of the bulk acoustic wave resonator includes multiple sawtooth structures A.

Referring to FIG. 5, multiple side surfaces of the upper electrode 1, multiple side surfaces of the piezoelectric layer 2 and multiple side surfaces of the lower electrode 3 may all be provided with multiple sawtooth structures A, so that the multiple side surfaces of the upper electrode 1, the multiple side surfaces of the piezoelectric layer 2 and the multiple side surfaces of the lower electrode 3 are all formed with irregular edges. If the upper electrode 1, the piezoelectric layer 2 and the lower electrode 3 are orthogonally projected in the thickness direction a-o of the bulk acoustic wave resonator, at least one boundary of the orthogonal projection of the side surface edge of the upper electrode 1, the side surface edge of the piezoelectric layer 2 and the side surface edge of the lower electrode 3 which have the same shape includes the shape of multiple sawtooth structures A (for the shape of the orthogonal projection, reference may be made to FIG. 3). Therefore, after the bulk acoustic wave resonator is connected to an external power supply, when bulk acoustic waves in other directions generated in the piezoelectric layer 2 in addition to a longitudinal bulk acoustic wave, such as transverse bulk acoustic waves, propagate in the piezoelectric layer 2 to multiple sawtooth-shaped side surfaces of the upper electrode 1 in contact with the air, multiple sawtooth-shaped side surfaces of the piezoelectric layer 2 in contact with the air and multiple sawtooth-shaped side surfaces of the lower electrode 3 in contact with the air, more chaotic reflections or more diffuse reflections occur, so that the formation of transverse standing waves or standing waves in other directions is prevented, the noise of the bulk acoustic wave resonator is reduced, and the performance of the bulk acoustic wave resonator is improved.

FIG. 5 illustratively shows the case where the shape of the upper electrode 1, the shape of the piezoelectric layer 2 and the shape of the lower electrode 3 are the same. In practical applications, the shape of the upper electrode 1, the shape of the piezoelectric layer 2 and the shape of the lower electrode 3 may be the same or different as long as the upper electrode 1, the piezoelectric layer 2 and the lower electrode 3 can be respectively formed with sawtooth-shaped side surfaces, which is not limited in the embodiment.

Figure 6:
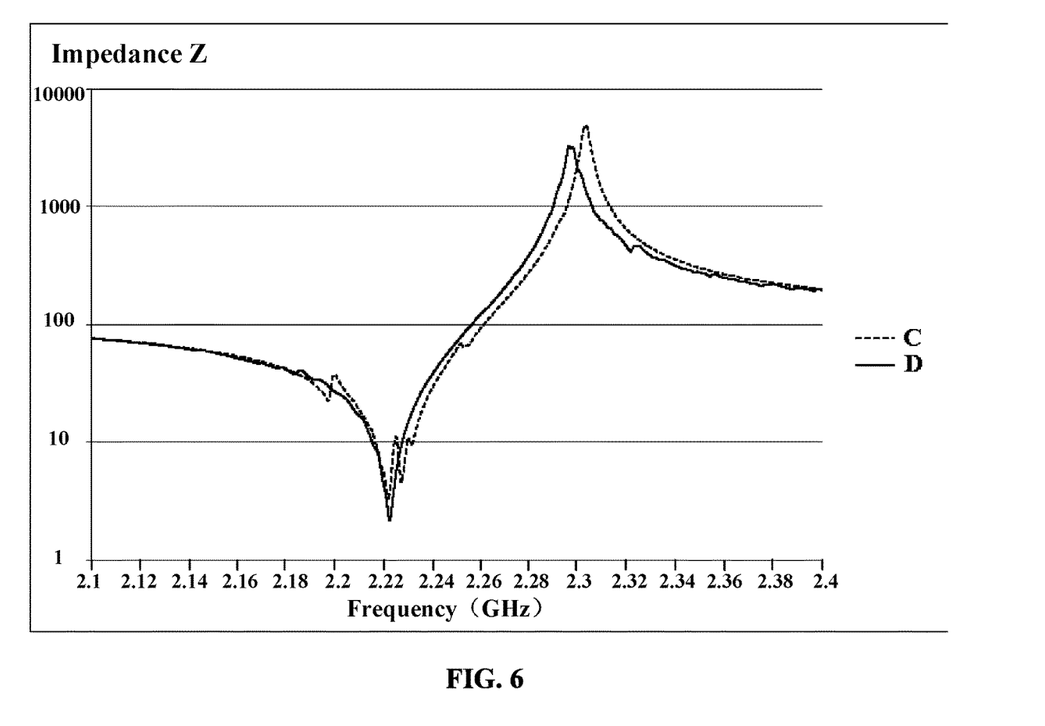
FIG. 6 is a schematic diagram of curves of functions of impedance and frequency of a bulk acoustic wave resonator according to an embodiment.

FIG. 6 is a schematic diagram of curves of functions of impedance and frequency of a bulk acoustic wave resonator according to an embodiment. As shown in FIG. 6, curve C shown by the dotted line is the curve of the function of impedance and frequency of the bulk acoustic wave resonator provided in FIG. 4, and curve D is the curve of the function of impedance and frequency of the bulk acoustic wave resonator shown in FIG. 5. According to the functional relationship between the impedance and the frequency of the bulk acoustic wave resonator, the smoother the curve, the less the noise of the bulk acoustic wave resonator. It can be seen that the bulk acoustic wave resonator including sawtooth structures A provided by the embodiment has less noise, and thus the performance of the device is better.

Referring to FIG. 3, optionally, on the basis of the above technical solution, each boundary of the orthogonal projection of the piezoelectric layer on the lower electrode includes multiple sawtooth structures A. Exemplarily, when only the side surface of the piezoelectric layer is provided with sawtooth structures A, all side surfaces of the piezoelectric layer may be provided with multiple sawtooth structures A. Accordingly, all boundaries of the orthogonal projection of the piezoelectric layer on the lower electrode include multiple sawtooth structures A. When the side surface of the upper electrode, the side surface of the piezoelectric layer and the side surface of the lower electrode are all provided with sawtooth structures A, all side surfaces of the upper electrode, all side surfaces of the piezoelectric layer and all side surfaces of the lower electrode may be provided with multiple sawtooth structures A. Accordingly, if the upper electrode, the piezoelectric layer and the lower electrode are projected orthogonally in the thickness direction of the bulk acoustic wave resonator, all boundaries of orthogonal projections include multiple sawtooth structures A.

Figure 7:
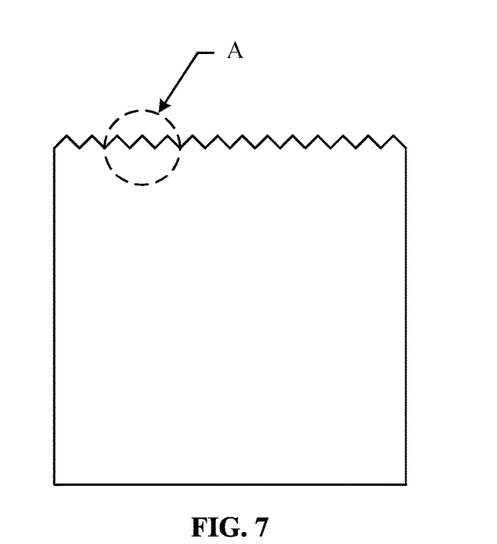
FIG. 7 is a schematic view of an orthogonal projection of another bulk acoustic wave resonator according to an embodiment.
Figure 8:
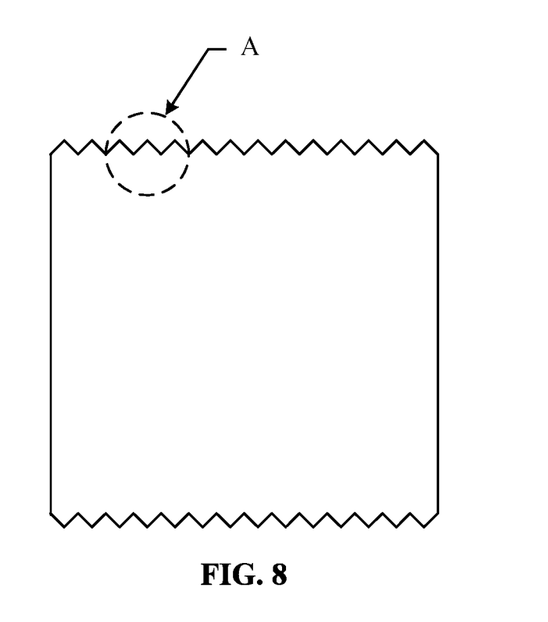
FIG. 8 is a schematic view of an orthogonal projection of another bulk acoustic wave resonator according to an embodiment.
Figure 9:
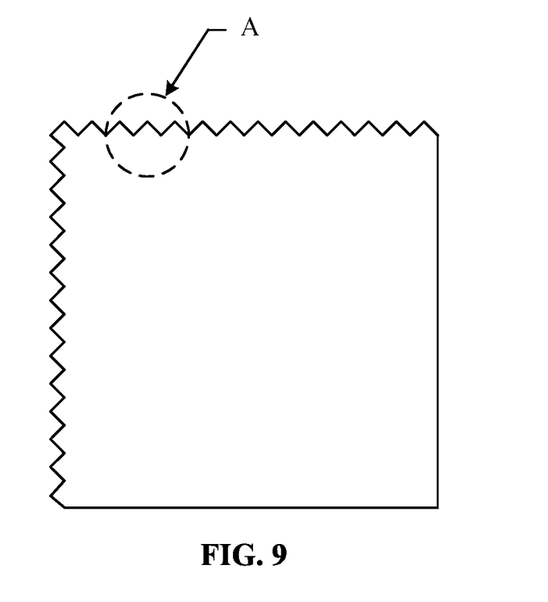
FIG. 9 is a schematic view of an orthogonal projection of another bulk acoustic wave resonator according to an embodiment.
Figure 10:
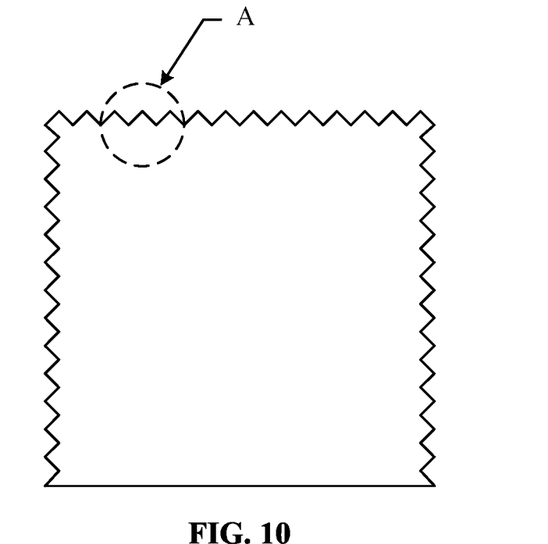
FIG. 10 is a schematic view of an orthogonal projection of another bulk acoustic wave resonator according to an embodiment.

Optionally, on the basis of the above technical solution, part of boundaries of the orthogonal projection of the piezoelectric layer on the lower electrode includes multiple sawtooth structures. It may be that any one boundary includes multiple sawtooth structures, any two boundaries include multiple sawtooth structures, or any three boundaries include multiple sawtooth structures. FIG. 7 is a schematic view of an orthogonal projection of another bulk acoustic wave resonator according to an embodiment, illustratively showing the case where one boundary of the orthogonal projection of the piezoelectric layer on the lower electrode includes multiple sawtooth structures A. FIG. 8 is a schematic view of an orthogonal projection of another bulk acoustic wave resonator according to an embodiment, and FIG. 9 is a schematic view of an orthogonal projection of another bulk acoustic wave resonator according to an embodiment. FIGS. 8 and 9 illustratively show two cases where two boundaries of the orthogonal projection of the piezoelectric layer on the lower electrode include multiple sawtooth structures A. FIG. 10 is a schematic view of an orthogonal projection of another bulk acoustic wave resonator according to an embodiment, illustratively showing the case where three boundaries of the orthogonal projection of the piezoelectric layer on the lower electrode include multiple sawtooth structures A.

When multiple side surfaces of the upper electrode, multiple side surfaces of the piezoelectric layer and multiple side surfaces of the lower electrode of the bulk acoustic wave resonator are all provided with sawtooth structures, if the upper electrode, the piezoelectric layer and the lower electrode are projected orthogonally in the thickness direction of the bulk acoustic wave resonator, for the shape of the projections, reference may be made to FIG. 3 and FIGS. 7 to 10. The case where only the piezoelectric layer is provided with sawtooth structures A, or the case where the upper electrode, the piezoelectric layer and the lower electrode are all provided with sawtooth structures A, and the setting of sawtooth structures A on each side surface in the above two cases may be determined according to actual applications.

As shown in FIGS. 7 to 10, optionally, on the basis of the above technical solution, multiple sawtooth structures A are sequentially connected end to end on the boundary. Each sawtooth structure A includes two sides that intersect. The intersecting point is the vertex, and the non-intersecting point is the end point. Multiple sawtooth structures A may be set to be connected end to end through end points, so that the side surface of the piezoelectric layer is formed with multiple consecutive sawtooth structures A, or the side surface of the upper electrode, the side surface of the piezoelectric layer and the side surface of the lower electrode are formed with multiple consecutive sawtooth structures A, and the boundary of the corresponding projection also includes multiple sawtooth structures A sequentially connected end to end.

Figure 11:
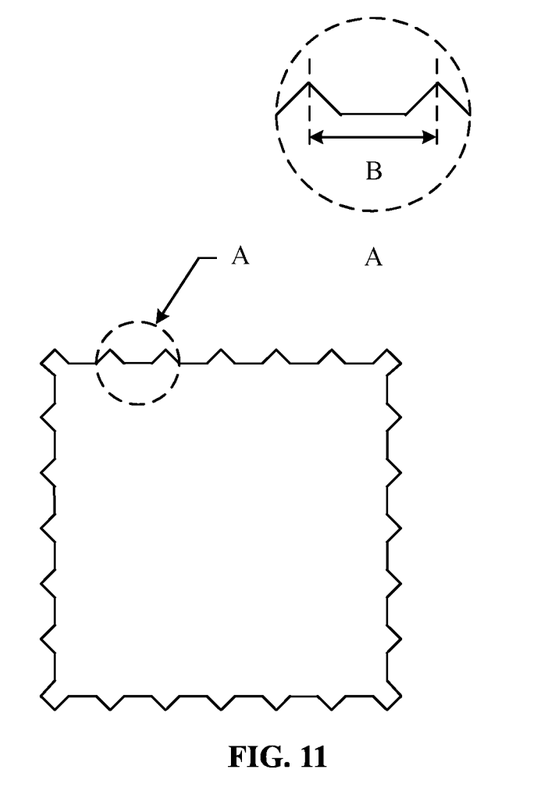
FIG. 11 is a schematic view of an orthogonal projection of another bulk acoustic wave resonator according to an embodiment.

FIG. 11 is a schematic view of an orthogonal projection of another bulk acoustic wave resonator according to an embodiment. As shown in FIG. 11, optionally, on the basis of the above technical solution, the side surface of the piezoelectric layer may be provided with multiple sawtooth structures A spaced at a set distance, or the side surface of the upper electrode, the side surface of the piezoelectric layer and the side surface of the lower electrode may be provided with multiple sawtooth structures A spaced at a set distance, and thus the boundary of the corresponding projection is formed with multiple inconsecutive sawtooth structures A.

As shown in FIGS. 7 to 11, optionally, on the basis of the above technical solution, multiple sawtooth structures A have the same shape. Through this setting, the process difficulty of manufacturing sawtooth structures and the process cost can be reduced.

Figure 12:
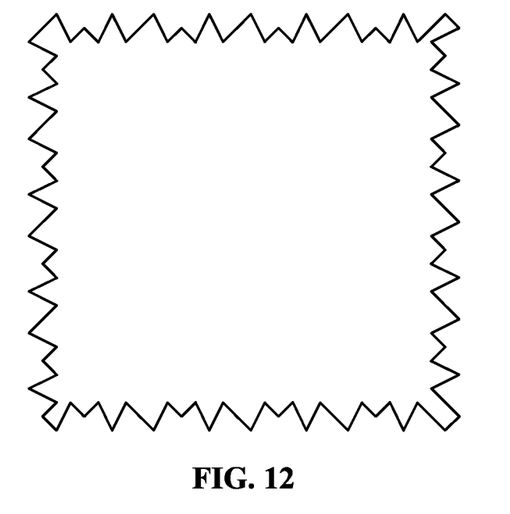
FIG. 12 is a schematic view of an orthogonal projection of another bulk acoustic wave resonator according to an embodiment.

FIG. 12 is a schematic view of an orthogonal projection of another bulk acoustic wave resonator according to an embodiment. As shown in FIG. 12, optionally, on the basis of the above technical solution, multiple sawtooth structures may have different shapes. The side surface of the piezoelectric layer, or the side surface of the upper electrode, the side surface of the piezoelectric layer and the side surface of the lower electrode may be provided with multiple sawtooth structures having the same shape or multiple sawtooth structures having different shapes. The sawtooth structures may be set according to actual applications and the effect of the sawtooth structures on the prevention of the generation of other forms of standing waves in addition to a longitudinal bulk acoustic wave.

In addition, multiple sawtooth structures may have the same or different sizes, which can be set according to requirements.

Figure 13:
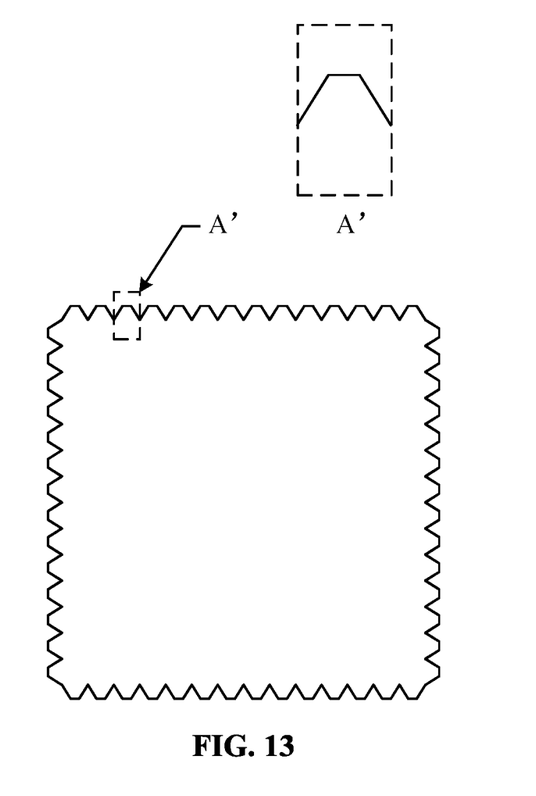
FIG. 13 is a schematic view of an orthogonal projection of another bulk acoustic wave resonator according to an embodiment.

Optionally, on the basis of the above technical solution, the shape of sawtooth structures includes a triangle or a trapezoid. Through this setting, the process of manufacturing sawtooth structures is relatively simple, and the process cost is reduced. FIG. 13 is a schematic view of an orthogonal projection of another bulk acoustic wave resonator according to an embodiment. FIGS. 2 to 3, FIG. 5 and FIGS. 7 to 12 show the case where the sawtooth structures are triangular, and FIG. 13 shows the case when the sawtooth structures A' are trapezoidal. The shape of the sawtooth structures can be selected according to actual applications and the effect of the sawtooth structures on prevention of the generation of other forms of standing waves in addition to a longitudinal bulk acoustic wave.

Referring to FIG. 11, optionally, on the basis of the above technical solution, a center-to-center distance of adjacent sawtooth structures A is greater than or equal to 2 micrometers. Through this setting, the process difficulty of manufacturing the sawtooth structures A and the manufacturing cost are reduced.

Figure 14:
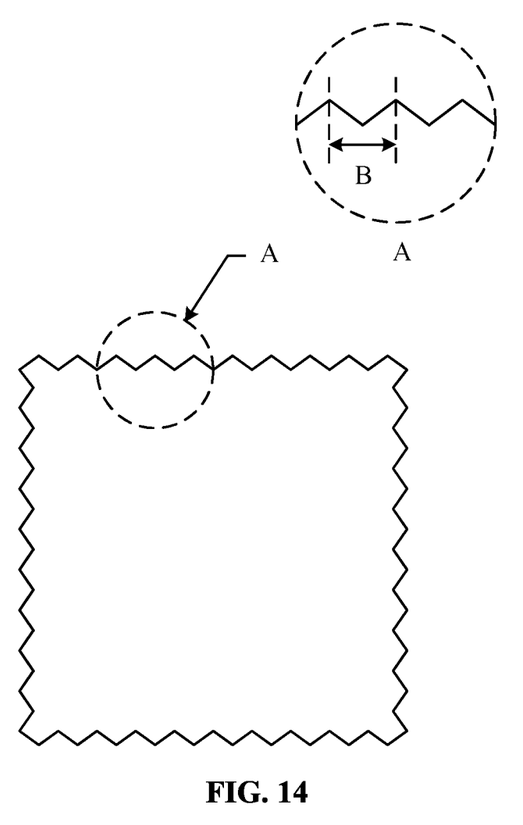
FIG. 14 is a schematic view of an orthogonal projection of another bulk acoustic wave resonator according to an embodiment.
Figure 15:
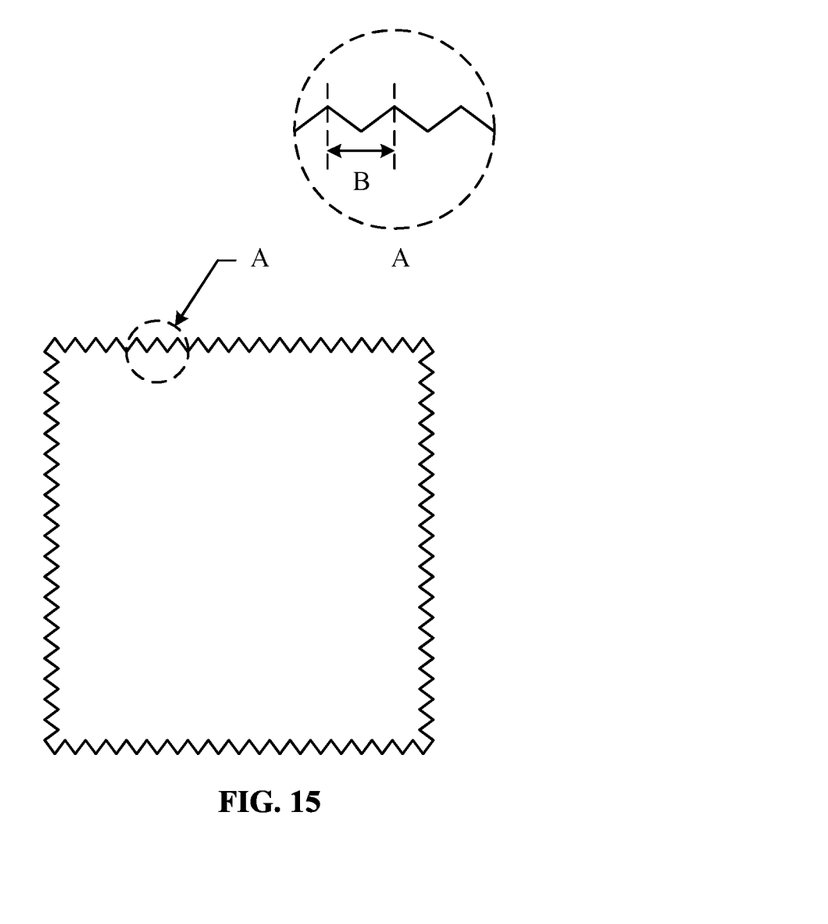
FIG. 15 is a schematic view of an orthogonal projection of another bulk acoustic wave resonator according to an embodiment.
Figure 16:
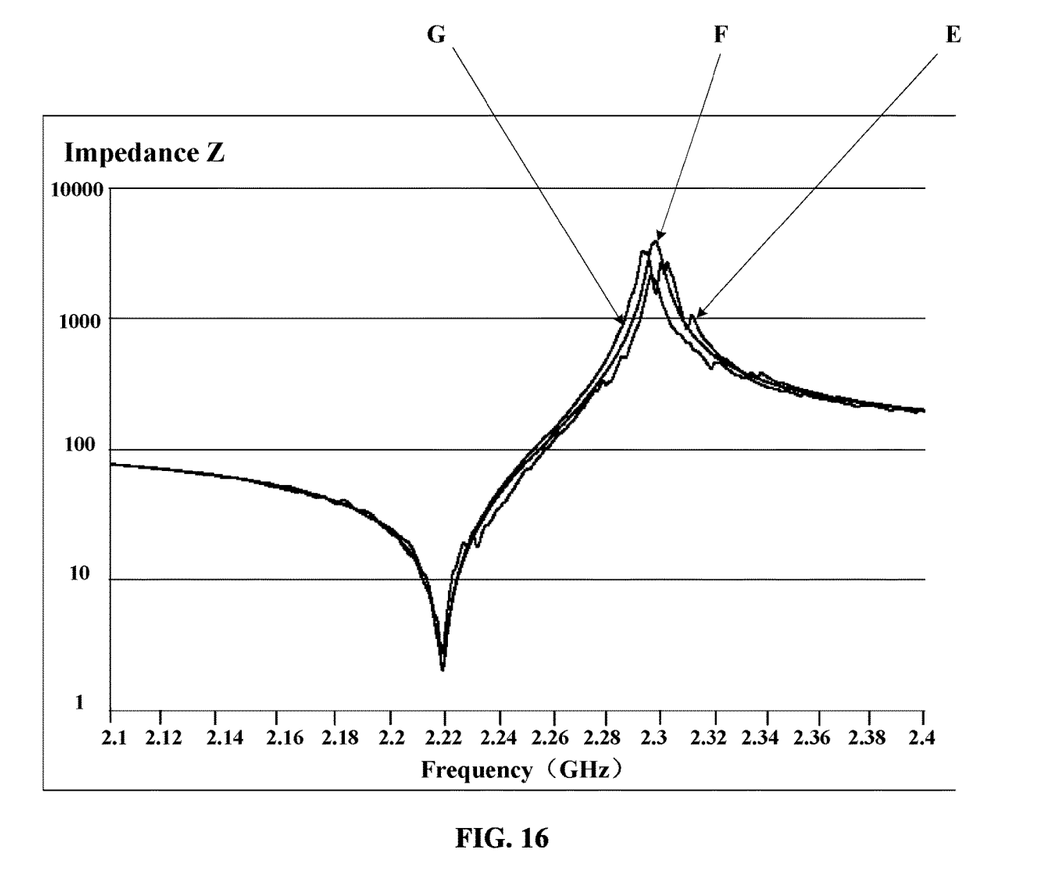
FIG. 16 is a schematic diagram of curves of functions of impedance and frequency of another bulk acoustic wave resonator according to an embodiment.

FIG. 14 is a schematic view of an orthogonal projection of another bulk acoustic wave resonator according to an embodiment, and FIG. 15 is a schematic view of an orthogonal projection of another bulk acoustic wave resonator according to an embodiment. FIG. 3 shows the case where multiple side surfaces of the piezoelectric layer in the thickness direction are all provided with multiple sawtooth structures A sequentially connected and having the same size, and the center-to-center distance B of adjacent sawtooth structures A is a common size. FIGS. 14 and 15 show the case where multiple side surfaces of the piezoelectric layer in the thickness direction are all provided with multiple sawtooth structures A sequentially connected and having the same size, and center-to-center distances B of adjacent sawtooth structures A are a sparse size and a dense size, respectively. FIG. 16 is a schematic diagram of curves of functions of impedance and frequency of another bulk acoustic wave resonator according to an embodiment. Curve G is the curve of the function of impedance and frequency of the bulk acoustic wave resonator corresponding to FIG. 3, and curves E and F respectively are the curve of the function of impedance and frequency of the bulk acoustic wave resonator corresponding to FIG. 14 and the curve of the function of impedance and frequency of the bulk acoustic wave resonator corresponding to FIG. 15. As shown in FIG. 16, the smoothness of curve E, the smoothness of curve G and the smoothness of curve F sequentially increase, and center-to-center distances B of adjacent sawtooth structures A in the corresponding multiple bulk acoustic wave resonators sequentially decrease. Therefore, the smaller the center-to-center distance B, the smoother the curve of the function of impedance and frequency of the bulk acoustic wave resonator, the less the noise of the bulk acoustic wave resonator, and the better the performance of the bulk acoustic wave resonator. Therefore, the denser the multiple sawtooth structures A on the side surface of the piezoelectric layer, or the denser the multiple sawtooth structures A on the side surface of the upper electrode, the multiple sawtooth structures A on the side surface of the piezoelectric layer and the multiple sawtooth structures A on the side surface of the lower electrode are set, the better the effect of preventing other forms of standing waves is. Exemplarily, the center-to-center distance B of adjacent sawtooth structures A may be set as a dense size ranging from 2 μm to 5 μm, or a common size ranging from 5 μm to 10 μm, or a sparse size ranging from 10 μm to 20 μm.

Figure 17:
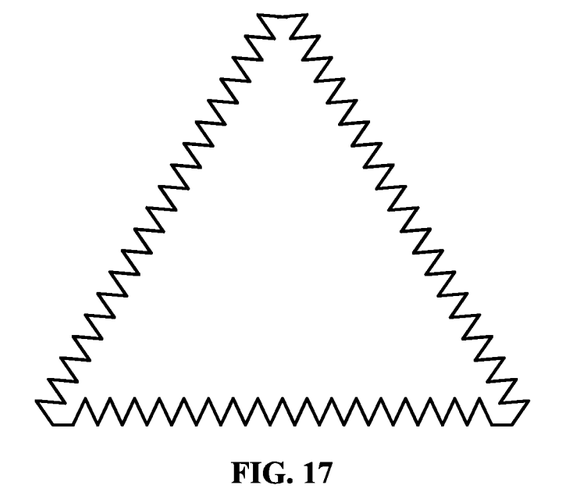
FIG. 17 is a schematic view of an orthogonal projection of another bulk acoustic wave resonator according to an embodiment.
Figure 18:
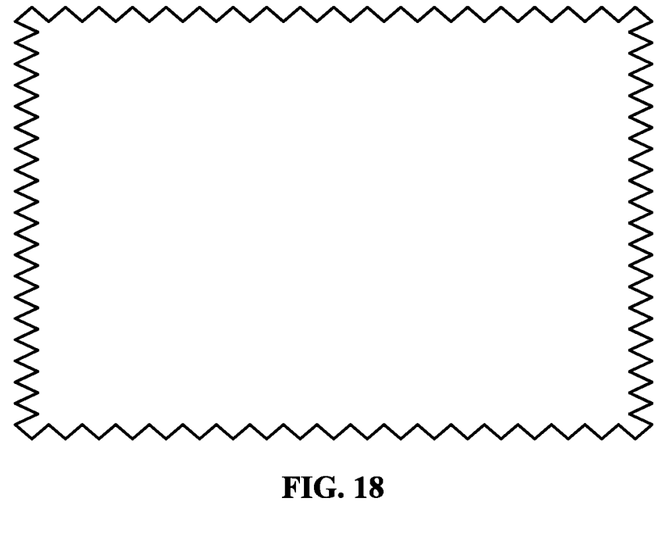
FIG. 18 is a schematic view of an orthogonal projection of another bulk acoustic wave resonator according to an embodiment.

FIG. 17 is a schematic view of an orthogonal projection of another bulk acoustic wave resonator according to an embodiment, and FIG. 18 is a schematic view of an orthogonal projection of another bulk acoustic wave resonator according to an embodiment. Optionally, on the basis of the above technical solution, the shape of the orthogonal projection of the bulk acoustic wave resonator on the plane perpendicular to the thickness direction of the bulk acoustic wave resonator includes a polygon. The shape of the orthogonal projection of the bulk acoustic wave resonator on the plane perpendicular to the thickness direction of the bulk acoustic wave resonator refers to the rough shape of the outline of the orthogonal projection. A polygon may be a plane figure composed of three or more line segments sequentially connected end to end, including a triangle, a quadrangle, a pentagon, and may be a regular polygon or an irregular polygon, where the quadrangle may be a square or a rectangle. FIG. 3 and FIGS. 7 to 15 show the setting of sawtooth structures on the bulk acoustic wave resonator when the outline of the orthogonal projection of the bulk acoustic wave resonator on the plane perpendicular to the thickness direction of the bulk acoustic wave resonator is square. FIGS. 17 and 18 respectively show the settings of sawtooth structures on the bulk acoustic wave resonator when the outlines of the orthogonal projection of the bulk acoustic wave resonator on the plane perpendicular to the thickness direction of the bulk acoustic wave resonator are triangular and quadrilateral. The bulk acoustic wave resonator may have different shapes according to the structure and application of the bulk acoustic wave resonator, and the bulk acoustic wave resonator with different shapes may be provided with sawtooth structures according to any embodiment.

Optionally, on the basis of the above technical solution, the material of the upper electrode and the material of the lower electrode is one of gold, molybdenum, aluminum, chromium or nickel, and may be another material for manufacturing the upper electrode and the lower electrode. The material of the piezoelectric layer is one of lead zirconate titanate piezoelectric ceramics, zinc oxide or aluminum nitride. Any of the above materials may be selected according to the structure and application scenarios of the bulk acoustic wave resonator and according to conductivity requirements of the upper electrode, the lower electrode and the piezoelectric layer.

What is claimed is:

1. A bulk acoustic wave resonator, comprising: an upper electrode, a piezoelectric layer and a lower electrode, wherein
the piezoelectric layer is disposed between the upper electrode and the lower electrode; and
at least one boundary of an orthogonal projection of the piezoelectric layer on the lower electrode comprises a plurality of sawtooth structures;
wherein a center-to-center distance of adjacent sawtooth structures among the plurality of sawtooth structures is greater than or equal to 2 micrometers.

2. The bulk acoustic wave resonator according to claim 1, wherein at least one boundary of orthogonal projections of the upper electrode and the lower electrode on a plane perpendicular to a thickness direction of the bulk acoustic wave resonator comprises a plurality of sawtooth structures.

3. The bulk acoustic wave resonator according to claim 1, wherein a material of the piezoelectric layer is one of lead zirconate titanate piezoelectric ceramics, zinc oxide or aluminum nitride.

4. The bulk acoustic wave resonator according to claim 1, wherein the at least one edge of the orthogonal projection of the piezoelectric layer on the lower electrode comprises a plurality of edges, each of the plurality of edges of the piezoelectric layer on the lower electrode comprises a plurality of sawtooth structures.

5. The bulk acoustic wave resonator according to claim 4, wherein the plurality of sawtooth structures of each of the plurality of edges of the piezoelectric layer on the lower electrode are sequentially connected end to end on each of the plurality of edges.

6. The bulk acoustic wave resonator according to claim 1, wherein a shape of the plurality of sawtooth structures comprises a triangle or a trapezoid.

7. The bulk acoustic wave resonator according to claim 1, wherein a shape of an orthogonal projection of the bulk acoustic wave resonator on a plane perpendicular to a thickness direction of the bulk acoustic wave resonator comprises a polygon.

8. The bulk acoustic wave resonator according to claim 1, wherein a material of the upper electrode and a material of the lower electrode is one of gold, molybdenum, aluminum, chromium or nickel.

* * * * *